United States Patent
Fijany et al.

(10) Patent No.: US 8,521,487 B2
(45) Date of Patent: Aug. 27, 2013

(54) METHOD FOR GENERATING A MINIMUM SET OF ANALYTICAL REDUNDANCY RELATIONS FOR THE DIAGNOSIS OF SYSTEMS

(75) Inventors: Amir Fijany, Serra Ricco' (IT); Farrokh Vatan, West Hills, CA (US)

(73) Assignee: Fondazione Istituto Italiano di Tecnologia, Genoa (IT)

( * ) Notice: Subject to any disclaimer, the term of this patent is extended or adjusted under 35 U.S.C. 154(b) by 60 days.

(21) Appl. No.: 13/041,644

(22) Filed: Mar. 7, 2011

(65) Prior Publication Data
US 2011/0218784 A1 Sep. 8, 2011

(30) Foreign Application Priority Data
Mar. 5, 2010 (IT) .............................. TO2010A0164

(51) Int. Cl.
*G06F 7/60* (2006.01)
*G06F 17/10* (2006.01)
*G06F 17/50* (2006.01)

(52) U.S. Cl.
CPC .................................. *G06F 17/5018* (2013.01)
USPC ......................................................... 703/2

(58) Field of Classification Search
USPC ....................... 703/2; 702/58–59; 714/25–26
See application file for complete search history.

(56) References Cited

U.S. PATENT DOCUMENTS
2010/0169030 A1* 7/2010 Parlos .............................. 702/58
2010/0235143 A1* 9/2010 Fijany et al. ................... 702/185
2011/0022891 A1* 1/2011 Fijany et al. ..................... 714/26

OTHER PUBLICATIONS

Staroswiecki et al. ("Analytical redundancy relations for fault detection and isolation in algebraic dynamic systemss") . 2001 Elsevier Science., p. 687-699.*
Amir Fijany, et al., "A New Efficient Method for System Structural Analysis and Generating Analytical Redundancy Relations," IEEE Aerospace Conference, Mar. 7, 2009, pp. 1-12.
Marie-Odile Cordier, et al., "Conflicts Versus Analytical Redundancy Relations: A Comparative Analysis of the Model Based Diagnosis Approach From the Artificial Intelligence and Automatic Control Perspectives," IEEE Transactions on Systems, Man, and Cybernetics-Part B: Cybernetics, Oct. 2004, pp. 2163-2177, vol. 34, No. 5.
Italian Search Report for IT TO20100164 dated Sep. 3, 2010.

* cited by examiner

*Primary Examiner* — Eunhee Kim
(74) *Attorney, Agent, or Firm* — Sughrue Mion, PLLC

(57) ABSTRACT

A method for generating a minimal set of Analytical Redundancy Relations representing a system to which a plurality of sensors is associated for the observation of variables indicative of operating conditions and adapted to enable detection and isolation of faults. The minimal set of Analytical Redundancy Relations is derived from a complete set of Analytical Redundancy Relations in implicit form, for which an associated binary Fault Signature Matrix is specified, and comprises the relations associated to a minimal subset of rows of the original matrix, which has the same number of non-zero columns and the same number of distinct columns as the original matrix.

8 Claims, 4 Drawing Sheets

METHOD FOR GENERATING A MINIMUM SET OF ANALYTICAL REDUNDANCY RELATIONS FOR THE DIAGNOSIS OF SYSTEMS

FIELD OF THE INVENTION

This invention pertains to system diagnostics in general and specifically to the generation of Analytical Redundancy Relations used in model-based system diagnostics.

More specifically, the invention relates to a method for the generation of a set of Analytical Redundancy Relations of the type defined in the preamble of claim 1.

BACKGROUND OF THE INVENTION

The operation of a plant—in this description and in the attached claims this term means industrial plants, manufacturing or research equipment, various types of vehicles (e.g. aircraft or spacecraft)—is controlled usually by means of complex diagnostic systems able to detect and isolate faulty operation conditions as soon as they happen. In ground-controlled space missions, either in Earth orbit or in deep space, prominent attention is devoted to the diagnosis of the system formed by the spacecraft and its onboard equipment, and in particular to the real-time detection of system faults, to correct the malfunctions which might compromise the mission.

The basic principle of model-based diagnostics is the comparison between the expected or nominal behaviour of a system, provided by a model of the system, and the actual behaviour inferred from measurements on the system, acquired by means of a set of sensors associated to said system to detect any discrepancy (inconsistency) and to diagnose the causes (faults).

In the last few decades, research in the field of system diagnostics, based on a model describing the functions of the system components and its connectivity or topology, has been carried out essentially according to two different paths: one, the approach of Fault Detection and Isolation (FDI), exploits the complete knowledge of the system and is based on automatic control theories and statistical decisions; the other, known as DX approach, does not need the complete knowledge of the system and is based on Artificial Intelligence techniques applied to a set of assumptions on the modes of operation of the system as a whole.

The FDI approach uses for its application the Analytical Redundancy Relations (ARRs), also known as residuals or parity equations, each of them representing a different relation between measured parameters of the system. Each unsatisfied ARR indicates a discrepancy between the expected system behaviour and the actual one, and allows the detection of a system malfunction, due to some fault, compared to normal operation. If for a set of sensor measurements of the system a specific ARR is unsatisfied, then at least one of the components of the support set of that ARR, i.e. the components involved in the ARR derivation, is faulty.

A system model (System Model, SM) is defined to consist of a Behavioral Model (BM) and the Observation Model (OM). The Behavioral Model BM is a component-based description of the system and consists of a set of Primary Relations (PRs). Each component is described by the function that it performs, i.e., by one or more PRs, and its inputs and outputs, such a component-based description also includes the topology of the system. The OM is the set of relations defining the observations that are performed on the system by means of a set of sensors associated to said system.

FIG. 1 shows an example of a polybox system consisting of four Multipliers ($M_1$, $M_2$, $M_3$, $M_4$) and three adders ($A_1$, $A_2$, $A_3$).

The Behavioral Model BM for this system, representing a component-based description and the topology, is given by a set of PRs and their associated components as:

| | |
|---|---|
| $PR_1: x=ab;$ | $M_1$ |
| $PR_2: y=bc;$ | $M_2$ |
| $PR_3: z=cd;$ | $M_3$ |
| $PR_4: t=de;$ | $M_4$ |
| $PR_5: f=x+y;$ | $A_1$ |
| $PR_6: g=y+z;$ | $A_2$ |
| $PR_7: h=z+t;$ | $A_3$ |

The diagnostic technique according to the FDI approach is based on the concepts of Analytical Redundancy Relation (ARR) and Fault Signature Matrix (FSM) which are briefly discussed in the following, for the sake of clarity and simplicity considering the case of single fault only in a system.

The set of variables (V) of a system, i.e. the system of FIG. 1, can be decomposed into a set of unknown (unobserved) variables (X) and a set of observed variable (O), i.e., $V=X \cup O$.

An Analytical Redundancy Relation (ARR) is a constraint deduced from the system model (SM). ARRs can be derived from SM by eliminating the unknown (unobserved) variables from the PRs. Therefore, an ARR contains only, and hence can be evaluated from, observed variables.

The support of an ARR is the subset of components that are involved in the derivation of the ARR.

For the system of FIG. 1, if the sensors are placed at outputs f, g and h, and with known inputs a, b, c, d, e, then O={a, b, c, d, e, f, g, h} and X={x, y, z, t}.

The resulting ARRs are given in following Table 1:

TABLE 1

ARR, support components, and sensors for the example in FIG. 1

| n. | Relazione | Componenti | Sensori |
|---|---|---|---|
| $ARR_1$ | f = a b + b c | $M_1, M_2, A_1$ | f |
| $ARR_2$ | g = b c + c d | $M_2, M_3, A_2$ | g |
| $ARR_3$ | h = c d + d e | $M_3, M_4, A_3$ | h |
| $ARR_4$ | f − g = a b − c d | $M_1, M_3, A_1, A_2$ | f, g |
| $ARR_5$ | g − h = b c − d e | $M_2, M_4, A_2, A_3$ | g, h |
| $ARR_6$ | f − g + h = ab + de | $M_1, M_4, A_1, A_2, A_3$ | f, g, h |

ARRs are used to check the consistency of the observations with respect to SM. That is, the ARRs are satisfied if the observed system behavior satisfies the model constraint, i.e. provides observations expected from the model.

Under single-fault exoneration assumption, if a component of an ARR support is faulty, then that ARR is not satisfied.

In fact, coupled with the concept of support set, this forms the foundation of model-based diagnosis approach in the FDI community.

The Fault Signature Matrix (FSM) can be deduced from the ARRs. The FSM is defined as a binary matrix whose rows are the ARRs generated for the system under study and whose columns represent the system components (faults). An element $FSM_{ij}$ of this matrix is assigned 1 if component $C_i$ is part of support of $ARR_j$, otherwise $FSM_{ij}=0$. The i-th column corresponding to component $C_i$ is defined as the fault signature vector of $C_i$ and it is denoted as $FSV_i=[FSV_{i1}, \ldots, FSV_{in}]^t$.

For the system of FIG. 1, the FSM can be derived from Table 1 and is given in Table 2.

TABLE 2

Fault Signature Matrix for System of FIG. 1

| ARR | $M_1$ | $M_2$ | $M_3$ | $M_4$ | $A_1$ | $A_2$ | $A_3$ |
|---|---|---|---|---|---|---|---|
| $ARR_1$ | 1 | 1 | 0 | 0 | 1 | 0 | 0 |
| $ARR_2$ | 0 | 1 | 1 | 0 | 0 | 1 | 0 |
| $ARR_3$ | 0 | 0 | 1 | 1 | 0 | 0 | 1 |
| $ARR_4$ | 1 | 0 | 1 | 0 | 1 | 1 | 0 |
| $ARR_5$ | 0 | 1 | 0 | 1 | 0 | 1 | 1 |
| $ARR_6$ | 1 | 0 | 0 | 1 | 1 | 1 | 1 |

The model-base diagnosis approach is based on evaluation of ARRs given a set of system observations.

The ARRs are instantiated with the inputs and observed values providing an observed signature. If an $ARR_i$ is satisfied based on the observation, then $ARR_i=0$, otherwise $ARR_i=1$. The signature of i-th observation is defined as a binary vector $OS_i=[OS_{i1}, \ldots, OS_{in}]^t$, where $OS_{ij}=0$ if $ARR_j$ is satisfied by the observations, and $OS_i=1$ otherwise.

Table 3 shows the diagnosis of the system of FIG. 1 for a subset of all possible observations.

TABLE 3

Diagnosis of system of FIG. 1 using ARRs for a Subset of Possible Observations

| ARRs | Observations | | | | | |
|---|---|---|---|---|---|---|
| $ARR_1$ | 0 | 1 | 1 | 0 | 1 | 1 |
| $ARR_2$ | 0 | 0 | 1 | 0 | 1 | 0 |
| $ARR_3$ | 0 | 0 | 0 | 1 | 1 | 1 |
| $ARR_4$ | 0 | 1 | 0 | 0 | 0 | 1 |
| $ARR_5$ | 0 | 0 | 1 | 1 | 1 | 1 |
| $ARR_6$ | 0 | 1 | 0 | 1 | 1 | 1 |
| Diagnosis | No faults | $M_1$ or $A_1$ | $M_2$ | $M_4$ or $A_3$ | $\{M_2, M_4\}$ or $\{M_2, A_3\}$ | $\{M_1, M_4\}$ or $\{A_1, A_3\}$, or $\{M_1, A_3\}$ or $\{M_4, A_1\}$ |

The diagnosis is given on the basis of faults accounted for in the fault signature matrix, that is, an observed signature $OS_i=[OS_{i1}, \ldots, OS_{in}]^t$ is consistent with a fault signature $FS_i=[FS_{i1}, \ldots, FS_{in}]^t$ if $FS_{ij}=OS_{ij}$ for all j.

For example, for the system in FIG. 1 the $OS=[1,0,0,1,0,1]^t$ is equivalent to the fault signature of components $M_1$ and $A_1$.

Notice that this shows that, depending on the system sensors, the faults of components $M_1$ and $A_j$ cannot be discriminated, as in the case of $A_3$ and $M_4$.

The criterion of detection and isolation (fault discrimination) can be described in terms of FSM. A given faulty component $C_i$ can be detected if its signature vector FSV of the fault is not a vector with all zero elements, that is at least one ARR is affected. All faults can be detected (complete detection) if there is no null column (i.e. no FSV with all zero elements) in the FSM. Fault isolation is guaranteed by requiring that there are no two identical columns in the FSM, since this fact would imply that the two FSVs are identical and therefore the corresponding faults cannot be discriminated.

For the system of FIG. 1, as can be seen from Table 2, all faults can be detected and the faults of $M_2$, $M_3$, and $A_2$ can be isolated. However, the fault of $M_1$ from the fault of $A_1$ as well as the fault of $M_4$ from the fault of $A_3$ cannot be isolated. Therefore, the ambiguity sets for the system of FIG. 1 are $\{M_1, A_1\}$ and $\{M_4, A_3\}$.

The multiple faults case can be treated by expanding the columns of the FSM matrix of single fault. The signature vector FSV of a multiple fault is obtainable from the $FSV_k$ signature vectors of the single faults which occurred simultaneously by performing an OR operation among the corresponding elements of the respective signature vectors $FSV_k$. In more rigorous terms, if a multiple fault is defined as $MFSV_k$, corresponding to simultaneous occurrence of faults of components $C_i, \ldots, C_j$, then the elements of $MFSV_k$ are $MFSV_{kp}=0$, if $FSV_{ip}=\ldots=FSV_{jp}=0$, otherwise $MFSV_{kp}=1$. Therefore, in a system with n components, consideration of all possible multiple faults combinations would lead to build a FSM matrix with $2^n$ columns.

Table 4 shows the signature fault matrix of the system of FIG. 1 with all the possible double faults. Combining Tables 2 and 4 gives the fault matrix for all single and double faults of the system.

TABLE 4

Signature Matrix of Double Faults for the system of FIG. 1

| $M_1$ | $M_1$ | $M_1$ | $M_1$ | $M_1$ | $M_1$ | $M_2$ | $M_2$ | $M_2$ | $M_2$ | $M_2$ | $M_3$ | $M_3$ | $M_3$ | $M_3$ | $M_4$ | $M_4$ | $M_4$ | $A_1$ | $A_1$ | $A_2$ |
| $M_2$ | $M_3$ | $M_4$ | $A_1$ | $A_2$ | $A_3$ | $M_3$ | $M_4$ | $A_1$ | $A_2$ | $A_3$ | $M_4$ | $A_1$ | $A_2$ | $A_3$ | $A_1$ | $A_2$ | $A_3$ | $A_2$ | $A_3$ | $A_3$ |
|---|---|---|---|---|---|---|---|---|---|---|---|---|---|---|---|---|---|---|---|---|
| 1 | 1 | 1 | 1 | 1 | 1 | 1 | 1 | 1 | 1 | 1 | 0 | 1 | 0 | 0 | 1 | 0 | 0 | 1 | 1 | 0 |
| 1 | 1 | 0 | 0 | 1 | 0 | 1 | 1 | 1 | 1 | 1 | 1 | 1 | 1 | 0 | 1 | 0 | 1 | 0 | 1 |
| 0 | 1 | 1 | 0 | 0 | 1 | 1 | 1 | 0 | 0 | 1 | 1 | 1 | 1 | 1 | 1 | 1 | 0 | 1 | 1 |
| 1 | 1 | 1 | 1 | 1 | 1 | 1 | 0 | 1 | 1 | 0 | 1 | 1 | 1 | 1 | 1 | 0 | 1 | 1 | 1 |
| 1 | 0 | 1 | 0 | 1 | 1 | 1 | 1 | 1 | 1 | 1 | 0 | 1 | 1 | 1 | 1 | 1 | 1 | 1 | 1 |
| 1 | 1 | 1 | 1 | 1 | 1 | 0 | 1 | 1 | 1 | 1 | 1 | 1 | 1 | 1 | 1 | 1 | 1 | 1 | 1 |

In the diagnosis, the ARR tests can result in an observed signature that is not accounted in FSM, i.e., it is not equivalent to any FSV. In this case, the diagnosis can be done by determining multiple columns that collectively cover the signature observed, resulting in having to solve the hitting set problem that is of the minimal set of the components whose at least one of the components is accounted in each the support sets of the unsatisfied ARRs.

For example, in Table 3, the observation signature of $[1,1,1,0,1,1]^t$ is not accounted for in the FSM given in Table 2. In this case, at least one of the components of the support sets of the unsatisfied ARRs is faulty. The unsatisfied ARRs are $ARR_1$, $ARR_2$, $ARR_3$, $ARR_5$, and $ARR_6$. The support sets of these ARRs are, respectively, $\{A_1, M_1, M_2\}$, $\{A_2, M_2, M_3\}$, $\{A_3, M_3, M_4\}$, $\{A_2, A_3, M_2, M_4\}$, and $\{A_1, A_2, A_3, M_1, M_4\}$. The diagnosis is then determined by calculating the hitting set of these sets, which is obtained as $\{M_2, M_4\}$ or $\{M_2, A_3\}$.

As another example in Table 3, the observation signature of $[1,0,1,1,1,1]^t$ is not again accounted for in the FSM given in Table 2. The unsatisfied ARRs are $ARR_1$, $ARR_3$, $ARR_4$, $ARR_5$, and $ARR_6$. The support sets of these ARRs are, respectively, $\{A_1, M_1, M_2\}$, $\{A_3, M_3, M_4\}$, $\{A_1, A_2, M_1, M_3\}$, $\{A_2, A_3, M_2, M_4\}$, and $\{A_1, A_2, A_3, M_1, M_4\}$. The diagnosis is then determined by calculating the hitting set of these sets and is obtained as $\{M_1, M_4\}$, or $\{A_1, A_3\}$, or $\{M_1, A_3\}$, or $\{M_4, A_1\}$.

From the above discussion, the model-based diagnosis technique, by using ARRs, can be summarized in the following steps:

Preprocessing: Given the system model and deployed sensors for the system observation, the complete set of ARRs is derived. Then, the fault Signature matrix (FSM) for any desired number of faults is built so as to analyze the detection and isolation properties of the system and determine possible ambiguity sets;

Run-Time Diagnosis: this step is performed
  a) by calculating all the ARRs to determine unsatisfied ARRs and form the observation vector. If the observation vector matches any FSV then the diagnosis is completed. Otherwise,
  b) by solving a determination problem of an hitting set among the support sets of unsatisfied ARRs, this minimal set representing, in definitive, the system diagnosis.

Although ARRs are important not only for system diagnostics but also for the optimization and analysis of sensor systems, which are employed in diagnostics, the development of systematic and efficient approaches for ARRs generation has not attracted so far sufficient attention.

In fact, the actual methods for ARRs generation depend on the system they describe, and the derivation of a whole set of ARRs depends substantially on the experience and knowledge of an expert programmer in manipulating analytical equations, and it cannot be easily extended to a great number of systems or plants of interest.

A key fundamental issue in application of ARRs is the completeness of the set of ARRs.

For model-base diagnosis, the importance and criticality of the completeness of the set of ARRs follows from the fact that it can significantly affect the fault detection and isolation capability of the system. That is, a predetermined set of deployed sensors in a system can indeed provide a certain level of detection and isolation but this level cannot be achieved due to incompleteness of the set of ARRs.

The inventors, in their article "A new efficient method for system structural analysis and generating analytical redundancy relations", *Proc. IEEE Aerospace Conference*, March 2009, have discussed in detail the arguments related to the generation of a complete set of ARRs showing that the non-deterministic algorithms known in the art allow to compute uncomplete sets of ARRs, which differ according to the order in which the unknown variables are selected for the elimination. The most used algorithms for the generation of a complete set of ARRs have exponential complexity, thus making their application not practical for systems of interest. Otherwise, the method which is described in the article grants the efficient generation of the complete set and not redundant of ARRs whose complexity is only $O(L^4)$, in the worst case, where L is the number of relations in the system.

Another issue to be addressed by the inventors in the cited article is efficiency and in definitive the feasibility of the ARRs derivation, that is the actual processability in the derivation and computation (evaluation) of the ARRs in explicit form. As an ARR is by definition generated by combining a set of primary relations (PRs), such combination may require the inversion of the functions representing one or more PRs, expressed in analytical form. As a matter of fact, in real systems encountered in practical applications, the functions representing primary relations of some non-linear components cannot be inverted in analytical form, but can only be expressed numerically: this poses a further major obstacle, increasing the computational load of the procedure and limiting its practical applicability.

The method which is described in the cited article is based on the observation that the key step for model-based diagnosis as well as sensors optimization and analysis is the formation of the FSM. FSM describes logical relations between set of sensors and components of a controlled system or plant. This observation leads to a new appreciation and interpretation of the real power of ARRs. In fact, the power of the ARRs is in the logical relation that they establish between the set of sensors, involved in its evaluation, and the set of its support components. In order to exploit such a logical power of ARRs, we can use them in an implicit form, without any need for deriving the analytical form, at least in this phase of procedure.

In general, given the FSM of the system, it is possible to determine the capabilities of detection and isolation of faults of sensors associated to the system without any explicit evaluation of the analytical redundancy relations.

The proposed method is based on the derivation of ARRs and their supports as set operations.

This method allows the generation of implicit ARR and therefore the construction of the FSM matrix without the need to know precisely the analytic functions and their inversion by substituting equations and algebraic operations with sets and operations between sets.

However, it should be noted that for the application in the diagnosis of the system the explicit form of the ARR and therefore their assessment is always required, resulting in significant burden of calculation, even when there are no faults in the system.

In fact, according to the prior art, in a diagnosis procedure based on the analytical redundancy relations the whole set of relations for each measure for each sensor system should be assessed, as it is not possible to determine a priori a subset of ARRs which is sufficient to calculate in order to meet the incidental need of diagnosis. Moreover, the calculation of each relation may require a considerable number of numerical operations for the reason that for many practical systems of interest the set of ARRs cannot be obtained in analytical form.

For systems where the timely detection of faulty components is of prime importance, excessive computational complexity is an obstacle to the adoption of this technique.

For this reason, the number of analytical redundancy relations acquires extreme importance during the real-time diagnosis.

In summary, the drawbacks of the prior art of diagnosis based on the derivation of analytical redundancy relations are the need of completeness of the set of ARRs, the number and complexity of derivation of the ARRs, making of an analytical form of ARRs for their calculation, the complexity of calculating the ARRs and the complexity of solving problems of hitting set for the determination of the set of potential faulty components.

The process of generating a set of analytical redundancy relations developed by the inventors and described in "A new efficient method for structural system analysis and generating analytical redundancy relations", *Proc IEEE Aerospace Conference*, March 2009, allows to obviate the first three drawbacks, because it teaches a method of derivation of a complete set of ARRs in implicit form efficient and practical at the same time, making this method potentially applicable to any system of interest.

SUMMARY OF THE INVENTION

The present invention aims at providing a satisfactory solution to the problems exposed above, while avoiding the drawbacks of the known art.

More specifically, the present invention aims at providing an efficient method, particularly from the point of view of computation, for the derivation of a adequate minimal set of ARRs for the timely diagnosis of critical faults in a system whose whole set of ARRs has a high numerosity.

According to the present invention, these goals are achieved thanks to a method for the generation of a set of ARRs providing the features stated in Claim 1.

Specific embodiments are the object of dependent claims, whose content is to be taken as integral or integrating part of the present description.

Further objects of the invention are a diagnostic method and system and a computer program for carrying out the above described methods, as claimed.

The present invention is based on the principle that for any system there might be a subset of ARRs which provides the same level of detection and isolation as the whole complete set of ARRs, that is, a subset of ARRs which leads to a FSM with the same detection and isolation capability as of the original FSM.

Particularly the invention relates to minimal subsets, that is, those with the smallest number of ARRs.

To better see this, consider the system of FIG. 1 and the FSM for single faults given in Table 2. Now let us consider the ARR subset $\{ARR_1, ARR_2, ARR_5\}$.

The new reduced FSM by using this subset of ARRs is presented in Table 5.

TABLE 5

Fault Signature Matrix for the system of FIG. 1 derived from a Minimal Set of ARRs

| ARR | $M_1$ | $M_2$ | $M_3$ | $M_4$ | $A_1$ | $A_2$ | $A_3$ |
|---|---|---|---|---|---|---|---|
| $ARR_1$ | 1 | 1 | 0 | 0 | 1 | 0 | 0 |
| $ARR_2$ | 0 | 1 | 1 | 0 | 0 | 1 | 0 |
| $ARR_5$ | 0 | 1 | 0 | 1 | 0 | 1 | 1 |

An analysis of the FSM in Table 5 shows that it has exactly the same faults detection and isolation properties as the FSM in Table 2. That is, all faults to the system can be detected, the faults of $M_2$, $M_3$, and $A_2$ can be isolated, the faults of $M_1$ and $A_1$, as well as $M_4$ and $A_3$, cannot be distinguished.

Therefore, it seems clear that the system of FIG. 1 can be fully diagnosed by only evaluating a subset of three ARRs $\{ARR_1, ARR_2, ARR_5\}$ instead of the whole set of six ARRs.

The subset $\{ARR_1, ARR_2, ARR_5\}$ is actually a minimal set of ARRs for single fault diagnosis of the system of FIG. 1.

Moreover, the minimal determined subset of ARRs is not unique, but for the system of FIG. 1 actually there are 16 such minimal sets of ARRs, respectively $\{ARR_1, ARR_2, ARR_3\}$, $\{ARR_1, ARR_2, ARR_5\}$, $\{ARR_1, ARR_2, ARR_6\}$, $\{ARR_1, ARR_3, ARR_4\}$, $\{ARR_1, ARR_3, ARR_5\}$, $\{ARR_1, ARR_3, ARR_6\}$, $\{ARR_1, ARR_4, ARR_5\}$, $\{ARR_1, ARR_4, ARR_6\}$, $\{ARR_2, ARR_3, ARR_4\}$, $\{ARR_2, ARR_3, ARR_6\}$, $\{ARR_2, ARR_4, ARR_5\}$, $\{ARR_2, ARR_4, ARR_6\}$, $\{ARR_2, ARR_5, ARR_6\}$, $\{ARR_3, ARR_4, ARR_5\}$, $\{ARR_3, ARR_5, ARR_6\}$, and $\{ARR_4, ARR_5, ARR_6\}$.

Note that, the different sets of minimal ARRs lead to different FSMs all having the same detection and isolation properties.

For example, Table 6 shows the FSM obtained from the minimal set of ARRs comprising the relations $\{ARR_1, ARR_3, ARR_4\}$.

TABLE 6

Fault Signature Matrix for the system of FIG. 1 derived from a different Minimal Set of ARRs

| ARR | $M_1$ | $M_2$ | $M_3$ | $M_4$ | $A_1$ | $A_2$ | $A_3$ |
|---|---|---|---|---|---|---|---|
| $ARR_1$ | 1 | 1 | 0 | 0 | 1 | 0 | 0 |
| $ARR_3$ | 0 | 0 | 1 | 1 | 0 | 0 | 1 |
| $ARR_4$ | 1 | 0 | 1 | 0 | 1 | 1 | 0 |

This FSM is different from that of Table 5 but it has exactly the same faults detection and isolation properties.

To this regard, it should be noted that the possible existence of several minimal sets of ARRs indeed provides an additional degree of freedom in the derivation of the sets of ARRs for the diagnosis of a system, which can be exploited to achieve an even better computational efficiency in method of diagnosis. In fact, for any given system under examination by a careful analysis of all the possible minimal sets of ARRs, one can choose the set which requires minimal computation and/or can be evaluated more accurately, particularly when some of the components have nonlinear functions.

It should also be emphasized that the minimal set of ARRs can be defined for any multiple faults FSM, that is, for any number of faults.

For the system of FIG. 1, considering all the possible double faults, the minimal set of ARRs is of size 5. Also, it is again not unique and there are four minimal sets obtained respectively as $\{ARR_1, ARR_2, ARR_3, ARR_4, ARR_5\}$, $\{ARR_1, ARR_2, ARR_3, ARR_4, ARR_6\}$, $\{ARR_1, ARR_2, ARR_3, ARR_5, ARR_6\}$, and $\{ARR_1, ARR_2, ARR_4, ARR_5, ARR_6\}$.

The size of the minimal set increases with the number of faults, and we can also derive a lower and an upper limit on the required number of ARRs to maintain the level of detection and isolation of faults of the whole set of ARRs.

For a system that isolates m faults (which can be single or multiple), the number of minimal ARRs is at least $\log_2 m+1$. In fact, we can consider a FSV as a binary number and ARRs as binary bits for its representation. Therefore, in order to represents m distinct and non-zero FSVs, we need at least $\log_2 m+1$ bits, or ARRs.

For a system that isolates m faults (which can be single or multiple), the number of minimal ARRs is at most $m(m+1)/2$.

In fact we need at most m ARRs to avoid non-zero columns, and we need at most m(m−1)/2 ARRs to ensure distinct columns, and the maximum number of ARRs is obtained from the worst-case of a sum of these two numbers.

It should be noted that the above upper bound is actually too conservative. In fact, for most systems, both real and synthetic, which are studied by the inventors for the single fault case the number of minimal ARRs is much less than m.

BRIEF DESCRIPTION OF THE DRAWINGS

Additional features and advantages of the invention are better explained in the following detailed description, provided as a non-limiting example, with reference to the attached drawings, where.

DETAILED DESCRIPTION OF THE PREFERRED EMBODIMENTS

Figure 1:
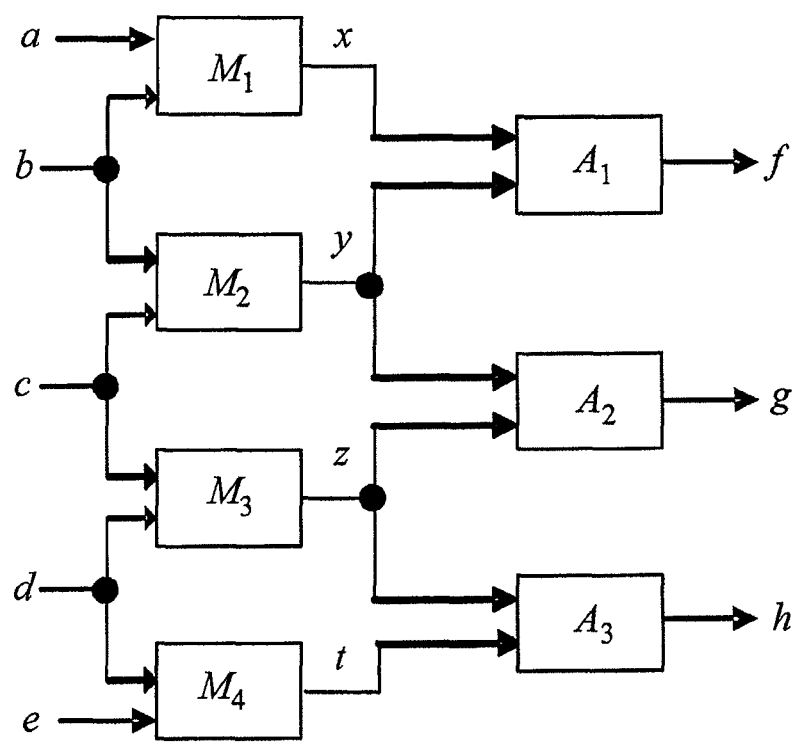
FIG. 1 depicts a circuit schematic of a multi-port system analyzed in the introductory part of this description.

The method subject of the invention is described in general terms in the following and then its application to two case studies and to a real system is demonstrated.

The method of finding the minimum sets of analytical redundancy relations is a process which implements an algorithm of optimization according to the technique of branch-and-bound from a complete set of analytical redundancy relations.

The problem of finding the minimal ARRs is formulated in terms of the signature matrix of a system as follows: given the signature matrix H corresponding to a complete set of ARRs, the problem is to find the minimal number of rows of H so that the corresponding sub matrix has the same detection and isolation property as H, that is, the same number of non-zero columns (detection) and the same number of distinct columns (isolation).

In other words, from the original complete signature matrix, one deletes as much as possible the rows (ARRs) so that remaining sub matrix has the same detection and isolation properties as H.

This problem can be formulated as a 0-1 integer programming problem or binary programming, in which the variables are bound to acquire binary values.

Let us consider a signature matrix H of dimension m×n. Let $M=H^T$ be the transpose of H. Then an equivalent formulation of the problem is as follows: choose a minimal subset of the columns of M such that the sub matrix defined by these columns has the same number of non-zero rows (revelation property) and the same number of distinct rows (isolation properties) as M.

At this regard, let us define an m dimensional binary vector $x=[x_1, x_2, \ldots, x_m]^T$, whose dimension is the same as the number of columns of the matrix M and $x_j=0$ or 1. Then we can interpret the product Mx as a selection of a subset of columns of M in the following manner: $x_j=1$ if and only if the j-th column of M is chosen.

Also define an n dimensional vector $b=[1, 1, \ldots, 1]^T$, i.e, b is a all-one column vector. Then the constraint $$M \cdot x \geq b$$

implies that the solution defined by x has the property that the corresponding sub matrix has no all-zero row (and the detection condition is satisfied).

To satisfy the discrimination condition, let us define a matrix $M_2$ with n(n−1)/2 rows and m columns as follows: each row $R_{i,j}$ of $M_2$ is associated with a (distinct) pair $R_i$ and $R_j$ of rows of M, and $R_{i,j}=|R_i-R_j|$; i.e., k-th entry of $R_{i,j}$ is equal to 1 if k-th entries of $R_i$ and $R_j$ are distinct, otherwise it is equal to 0. Then the constraint $$M_2 x \geq b$$

implies that the solution defined by x has the property that all rows of the corresponding sub matrix M are distinct.

So if we consider the composite matrix $$\tilde{M} = \begin{pmatrix} M \\ M_2 \end{pmatrix},$$

then the problem of finding the minimal set of ARRs can be formulated as the following linear integer binary programming problem:

minimize $x_1 + \ldots + x_m$ subject to $\tilde{M}x \geq b$.

The above integer programming formulation can easily be extended to the case where we consider different weights associated to the ARRs, in the sense that the weights reflects the computational complexity of the related ARRs such that simpler ARRs have smaller weights. In fact, many real systems involve components with non-linear functions whose calculation is more expensive and/or less precise than components which are describable by simpler functions. For these cases, once generated the complete set of ARRs a careful analysis allows to identify the relations whose calculation is heavy or less accurate. The derivation of the minimum set of ARRs which is more convenient to use may be done by assigning a cost of calculation and/or accuracy to each relation, by reducing the problem to the derivation of the minimum set of ARRs of minimal cost.

The solution of such problem is the simplest set of ARRs which provides the same level of detection and isolation. In this case we substitute the objective function by the following one minimize $c_1 x_1 + \ldots + c_m x_m$ where $c_j$ is the weight of the j-th ARR. Note that in this extended case the objective function remains linear.

An algorithm pseudo-code for the realization of the described method is reported in the following.

```
Minimal-ARR (H)
/* solves the minimal ARR problem defined by the signature matrix H */
1.  Labels = {({ }, { })}
2.  Solution = UpperBound[{ }, { }, H]
3.  Usen = size of Solution
4.  while Labels ≠ { }
5.       chose λ = (R_in, R_out) ∈ Labels
6.       Labels = Labels − {λ}
7.       if Closure |R_in| ∩ R_out = { } then
8.           upper = UpperBound [Closure[R_in], R_out ∪ R_2, H]
9.           if size of upper < Usen then
10.              Usen = size of upper
11.              Solution = upper
12.          end if
13.      end if
```

-continued

```
14.     if TestLeaf[R_in, R_out, Usen, H] = False then
15.         (λ_0, λ_1) = Split [R_in, R_out, H]
16.         Labels = Labels ∪ {λ_0, λ_1}
17.     end if
18. end while
19. return Solution
```

The subroutines mentioned in the algorithm own the following characteristics:

For a signature matrix H and two sets $R_1$ and $R_2$ of rows of H, the UpperBound[$R_1$, $R_2$, H] procedure returns a set rows which is a solution of the problem of reduction of the whole set of ARRs while we assume that $R_1$ is part of the solution and $R_2$ is not;

For a given set R of rows of the signature matrix H, Closure [R] procedure returns the set of all rows of H which depend only on ARRs involved in R;

For a signature matrix H, a label $\lambda=(R_{in}, R_{out})$, and a number U (which plays the role of the current upper bound of the number of ARRs), TestLeaf[$R_{in}$, $R_{out}$, U, H] procedure returns True if and only if this label describes a leaf of the search tree of the branch-and-bound algorithm, otherwise it returns False;

For a signature matrix H and the label ($R_{in}$, $R_{out}$), Split[$R_{in}$, $R_{out}$, H] procedure returns a pair of new labels.

A diagnosis system of a system or plant includes a workstation of known type (not shown), or a distributed processing system, including a computer subsystem and local or remote input/output devices, designed to execute a processing or computing program or program groups or modules stored on disk or accessible over a network, which implement the method (algorithm) subject of this invention. These solutions here outlined are considered well-known in the art and will not be further described here, as they are not relevant to the implementation and understanding of the present invention.

Application Examples

To demonstrate the above described method, we present in the following examples of application in two synthetic systems and in a real one.

Multiport Combinational Circuits

Figure 2A:
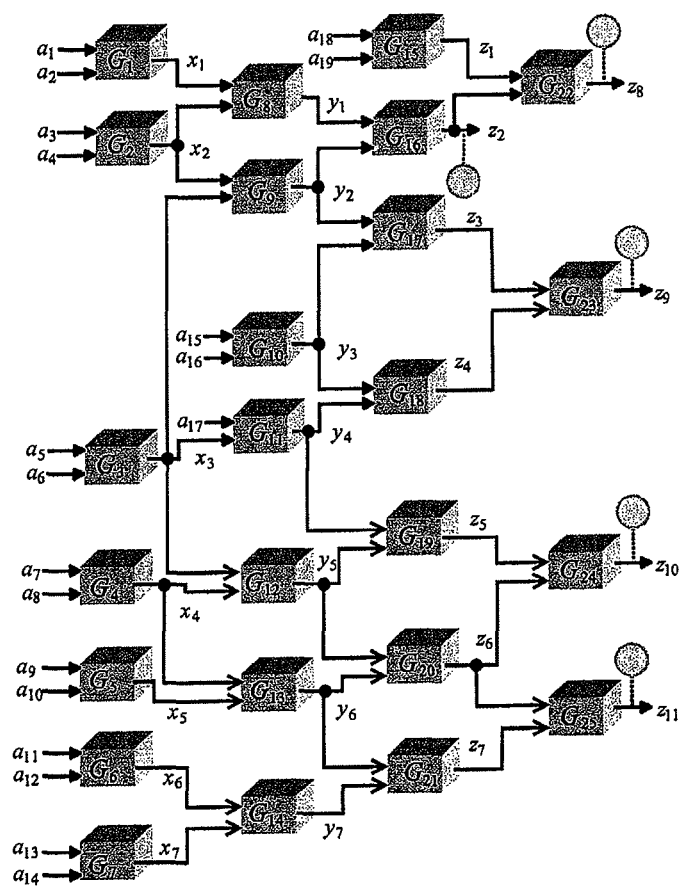
FIGS. 2a and 2b represent corresponding circuit schematics of combinatorial circuits to which the method object of this invention is applied.
Figure 2B:
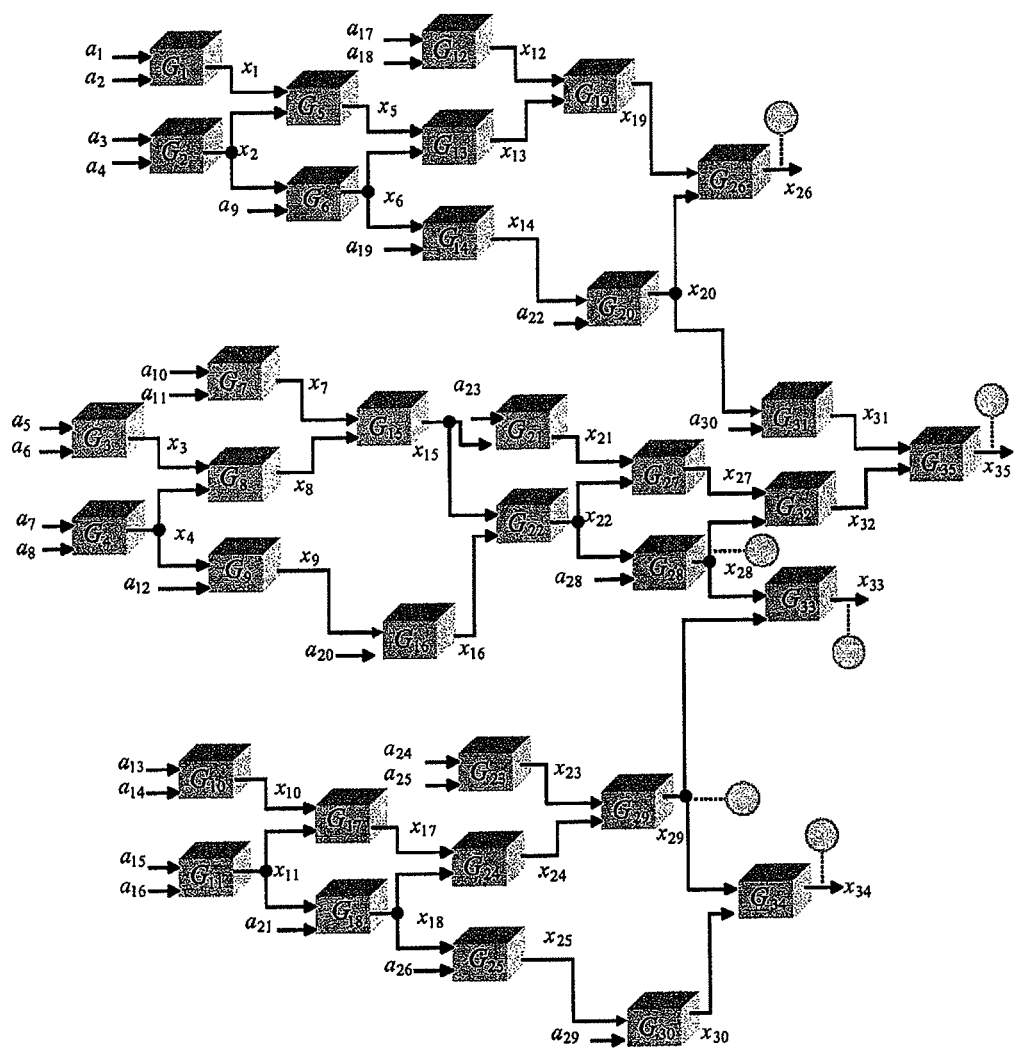
Figure 3:
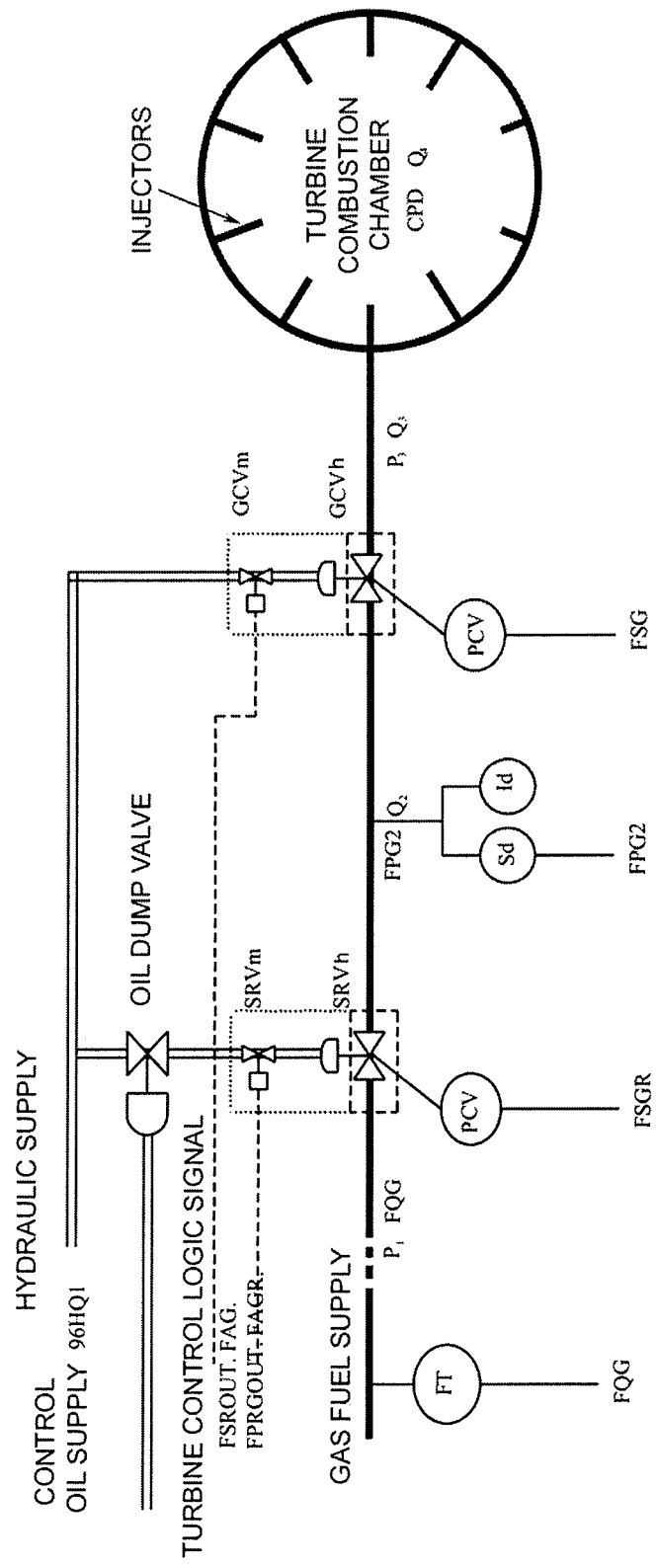
FIG. 3 is a schematic diagram of a subset of a turbine of an industrial plant, which is employed for the exemplification of the method object of this invention.

A check of the performance of the method subject of the invention was conducted by way of example on the circuit structures shown in FIG. 2a and in FIG. 2b, which show two schemes of combinational circuits which include adders and multipliers with a connectivity which is more complex than the system of FIG. 1.

The FIG. 2a shows a system with 25 components in which 5 sensors are deployed at the exits $z_2$, $z_8$, $z_9$, $z_{10}$, $z_{11}$.

The total number of ARRs for the system is 484. By applying the method subject of the invention it is possible to derive a minimal set of ARRs for single fault diagnosis of the system having a numerosity of 6, and a minimal set of ARRs for double-fault diagnosis having a numerosity of 17.

The FIG. 2b shows a system with 35 components in which 6 sensors are deployed at outputs $x_{26}$, $x_{28}$, $x_{29}$, $x_{33}$, $x_{34}$, $x_{35}$. The total number of ARRs is 2056 and a minimal set of ARRs for the single-fault diagnosis contains only 9 ARRs derived by applying the method object of invention.

Note, in general, that the size of minimal set of ARRs, i.e. the number of minimal ARRs, is much less than the number of faults (components) of the system.

In the analysis we did not need the description of the function of the system's components. Once the minimal set of ARRs is obtained the relations required can be evaluated through a consistency check using the knowledge of PRs involved, according to the prior art.

At this point, after determining the ARRs which are not satisfied, it is possible to form a vector of observation and diagnose the system by the FSM matrix, according to the traditional approach FDI or by applying the algorithm described by A. Fijany, A. Barrett, and F. Vatan, "A Novel Efficient Method for Conflict Sets Generation for Model-based Diagnosis," *Proc 3rd Int. Conf. on Space Mission Challenges for Information technology*, Pasadena, Calif., July 2009.

Gas Turbine System

The following example is a real system one, as a Gas Turbine System of an electricity generation plant.

Refer to the schematically representation of the subset of gas supply reported in FIG. 4.

The main components of the system are two actuators: the Stop Ratio Valve (SRV) and the Gas Control Valve (GCV). These valves are connected in series and control the flow of gas fuel that enters in the combustion chambers of the turbine. The first of these valves, the SRV, is controlled by a feedback loop that maintains the gas pressure constant at its output (pressure between the two valves) fpg2. This pressure being constant, the gas fuel flow is just determined by the position of the GCV valve, hence the GCV is a position controlled valve.

The components of the system are:

GCVh: Stop Ratio Valve Gas Control Valve (hydraulics component);

SRVh: Stop Ratio Valve (hydraulics component);

GCVm: Gas Control Valve (mechanics component); and

SRVm: Stop Ratio Valve (mechanics component).

We consider faults on components: GCVm, GCVh, SRVm, SRVh, injectors and four transducers. The set of faults is then given by {GCVm, GCVh, SRVm, SRVh, Inj, TFSG, TFSGR, TFQG, TCPD} where the symbol "Txyz" denotes the fault in the sensor "xyz". The primary relations of the system and their associated variables are shown in Table 8.

TABLE 8

Gas turbine system primary relations

| Component | Realtion | Equation | Exogenous variables |
|---|---|---|---|
| Injectors | $r_1$ | $Q_3 = K_{inj}\sqrt{P_3 - CPD}$ | CPD |
| Injectors | $r_2$ | $Q_4 - K_{lix} Q_3 = 0$ | |
| GCVh | $r_3$ | $Q_2 = FSG \sqrt{FPG2 - P_3}$ | |
| GCVh | $r_4$ | $Q_3 - K_1 Q_2 = 0$ | |
| SRVh | $r_5$ | $FQG = FSGR \sqrt{P_1 - FPG2}$ | $P_1$ |
| SRVh | $r_6$ | $Q_2 - K_1 FQG = 0$ | |
| GCVm | $r_7$ | $FSG = f(FAG, 96HQL)$ | 96HQL |
| SRVm | $r_8$ | $FSGR = f(FAGR, 96HQL)$ | 96HQL |
| GCVm | $r_9$ | $FSG = f(FSROUT, 96HQL)$ | FSROUT, 96HQL |
| SRVm | $r_{10}$ | $FSGR = f(FPG2, FPRGOUT, 96HQL)$ | FPRGOUT, 96HQL |
| SRVm + SRVh | $r_{11}$ | $FPG2 = f(FPRGOUT)$ | FPRGOUT |

Note that some of the primary relations are indicated in implicit form and only indicate the functional relation between variables.

The structural matrix of the system is then shown in Table 9.

TABLE 9

Turbine system structural matrix

| Faults | Q2 | Q3 | Q4 | P3 | FPG2 | FQG | FSG | FSGR | FAG | FAGR |
|---|---|---|---|---|---|---|---|---|---|---|
| Injector, TCPD | | X | | X | | | | | | |
| Injector | | | X | X | | | | | | |
| GCVh, TFSG | X | X | | X | X | | | | | |
| GCVh | X | X | | | | | | | | |
| SRVh, TFSGR, TFQG | | | | | | | X | | X | |
| SRVh, TFQG | X | | | | | | X | | | |
| GCVm, TFSG | | | | | | | | X | | X |
| GCVm, TFSGR | | | | | | | | X | | |
| SRVm, TFSG | | | | | | | | X | | X |
| SRVm, TFSGR | | | | | | | | X | | |
| SRVm, SRVh | | | | | X | | | | | |

This matrix shows that each primary relation of Table 8 is related to specific faults of the system.

The method for derivation of ARRs and the resulting FSM matrix which is described in "A new efficient method for system structural analysis and generating analytical redundancy relations", *Proc. IEEE Aerospace Conference*, March 2009, has been applied.

Using the structural matrix of Table 9 it is first possible to assume that the sensors can be actually placed physically at nine locations Q2, Q3, P3, FPG2, FQG, FSG, FSGR, FAG, FAGR. From the application of the method it is possible to obtain 551 implicit relations. In the following the numbering of ARRs indicates the position of the same ARRs in the complete set of 551 relations.

For the analysis of the existing 4 sensors of the fuel supply subsystem the subset of 26 ARRs corresponding to the 4 sensors has been selected from the complete set of 551 ARRs. The FSM resulting from these ARRs is presented in Table 10.

A careful analysis of the FSM matrix of Table 10 shows the detection and isolation abilities of the system and confirms that all faults can be detected, i.e. there are no columns of zeros only, and that all faults can be isolated, except the faults in GCVh (Gas Control Valve), Inj (Injector pressure) and CPD (Compressor Pressure). That is, the fault signature vectors FSV for these 3 faults are identical and then they cannot be distinguished The method object of invention is applied for determination of minimal sets of ARRs for the FSM given in Table 10, resulting in three minimal sets of size 4, that is $\{ARR_5, ARR_9, ARR_{11}, ARR_{121}\}$, $\{ARR_5, ARR_9, ARR_{11}, ARR_{237}\}$, and $\{ARR_9, ARR_{11}, ARR_{25}, ARR_{121}\}$. The FSMs corresponding to these set are presented respectively in Tables 11, 12, and 13.

TABLE 10

Fault Signature Matrix for Single Fault resulting from 4 sensors of Gas Turbine system.

| ARRs | GCVh | GCVm | Injt | SRVh | SRVm | TCpd | Tfqg | Tfsg | Tfsgr | Sensors |
|---|---|---|---|---|---|---|---|---|---|---|
| $ARR_5$ | 0 | 0 | 0 | 1 | 0 | 0 | 1 | 0 | 1 | {fpg2, fqg, fsgr} |
| $ARR_9$ | 0 | 1 | 0 | 0 | 0 | 0 | 0 | 1 | 0 | {fsg} |
| $ARR_{10}$ | 0 | 0 | 0 | 0 | 1 | 0 | 0 | 0 | 1 | {fsgr} |
| $ARR_{11}$ | 0 | 0 | 0 | 1 | 1 | 0 | 0 | 0 | 0 | {fpg2} |
| $ARR_{25}$ | 0 | 0 | 0 | 1 | 1 | 0 | 1 | 0 | 1 | {fpg2, fqg} |
| $ARR_{26}$ | 0 | 0 | 0 | 1 | 1 | 0 | 1 | 0 | 1 | {fqg, fsgr} |
| $ARR_{62}$ | 0 | 0 | 0 | 1 | 1 | 0 | 1 | 0 | 1 | {fqg} |
| $ARR_{121}$ | 1 | 0 | 1 | 1 | 0 | 1 | 0 | 1 | 0 | {fpg2, fqg, fsg} |
| $ARR_{231}$ | 1 | 0 | 1 | 1 | 0 | 1 | 0 | 1 | 1 | {fqg, fsg, fsgr} |
| $ARR_{232}$ | 1 | 0 | 1 | 1 | 0 | 1 | 0 | 1 | 0 | {fpg2, fsg, fsgr} |
| $ARR_{236}$ | 1 | 1 | 1 | 1 | 0 | 1 | 0 | 1 | 0 | {fpg2, fqg} |
| $ARR_{237}$ | 1 | 0 | 1 | 1 | 1 | 1 | 1 | 0 | 1 | {fqg, fsg} |
| $ARR_{378}$ | 1 | 1 | 1 | 1 | 0 | 1 | 0 | 1 | 1 | {fqg, fsgr} |
| $ARR_{379}$ | 1 | 1 | 1 | 1 | 0 | 1 | 0 | 1 | 1 | {fpg2, fsgr} |
| $ARR_{380}$ | 1 | 0 | 1 | 1 | 1 | 1 | 1 | 1 | 1 | {fpg2, fsg, fsgr} |
| $ARR_{382}$ | 1 | 0 | 1 | 1 | 1 | 1 | 1 | 1 | 1 | {fqg, fsg} |
| $ARR_{384}$ | 1 | 1 | 1 | 1 | 1 | 1 | 1 | 1 | 0 | {fqg} |
| $ARR_{398}$ | 1 | 0 | 1 | 1 | 1 | 1 | 1 | 1 | 1 | {fpg2, fsg} |
| $ARR_{399}$ | 1 | 0 | 1 | 1 | 1 | 1 | 1 | 1 | 1 | {fsg, fsgr} |
| $ARR_{497}$ | 1 | 1 | 1 | 1 | 1 | 1 | 1 | 1 | 1 | {fpg2, fsgr} |
| $ARR_{501}$ | 1 | 1 | 1 | 1 | 1 | 1 | 1 | 1 | 1 | {fqg} |
| $ARR_{508}$ | 1 | 1 | 1 | 1 | 1 | 1 | 1 | 1 | 1 | {fpg2} |
| $ARR_{509}$ | 1 | 1 | 1 | 1 | 1 | 1 | 1 | 1 | 1 | {fsgr} |
| $ARR_{510}$ | 1 | 0 | 1 | 1 | 1 | 1 | 1 | 1 | 1 | {fpg2, fsg} |
| $ARR_{511}$ | 1 | 0 | 1 | 1 | 1 | 1 | 1 | 1 | 1 | {fsg} |
| $ARR_{550}$ | 1 | 1 | 1 | 1 | 1 | 1 | 1 | 1 | 1 | {fpg2} |

TABLE 11

The Fault Signature Matrix with the First Set of Minimal ARRs with the 4 actual sensors

| | faults | | | | | | | | | |
|---|---|---|---|---|---|---|---|---|---|---|
| ARRs | GCVh | GCVm | Injt | SRVh | SRVm | TCpd | Tfqg | Tfsg | Tfsgr | Sensors |
| $ARR_5$ | 0 | 0 | 0 | 1 | 0 | 0 | 1 | 0 | 1 | {fpg2, fqg, fsgr} |
| $ARR_9$ | 0 | 1 | 0 | 0 | 0 | 0 | 0 | 1 | 0 | {fsg} |
| $ARR_{11}$ | 0 | 0 | 0 | 1 | 1 | 0 | 0 | 0 | 0 | {fpg2} |
| $ARR_{121}$ | 1 | 0 | 1 | 1 | 0 | 1 | 1 | 1 | 0 | {fpg2, fqg, fsg} |

TABLE 12

The Fault Signature Matrix with the Second Set of Minimal ARRs with the 4 actual sensors

| | faults | | | | | | | | | |
|---|---|---|---|---|---|---|---|---|---|---|
| ARRs | GCVh | GCVm | Injt | SRVh | SRVm | TCpd | Tfqg | Tfsg | Tfsgr | Sensors |
| $ARR_5$ | 0 | 0 | 0 | 1 | 0 | 0 | 1 | 0 | 1 | {fpg2, fqg, fsgr} |
| $ARR_9$ | 0 | 1 | 0 | 0 | 0 | 0 | 0 | 1 | 0 | {fsg} |
| $ARR_{11}$ | 0 | 0 | 0 | 1 | 1 | 0 | 0 | 0 | 0 | {fpg2} |
| $ARR_{237}$ | 1 | 0 | 1 | 1 | 1 | 1 | 1 | 1 | 1 | {fqg, fsg} |

TABLE 13

The Fault Signature Matrix with the Third Set of Minimal ARRs with the 4 actual sensors

| | faults | | | | | | | | | |
|---|---|---|---|---|---|---|---|---|---|---|
| ARRs | GCVh | GCVm | Injt | SRVh | SRVm | TCpd | Tfqg | Tfsg | Tfsgr | Sensors |
| $ARR_9$ | 0 | 1 | 0 | 0 | 0 | 0 | 0 | 1 | 0 | {fsg} |
| $ARR_{11}$ | 0 | 0 | 0 | 1 | 1 | 0 | 0 | 0 | 0 | {fpg2} |
| $ARR_{25}$ | 0 | 0 | 0 | 1 | 1 | 0 | 1 | 0 | 1 | {fpg2, fqg} |
| $ARR_{121}$ | 1 | 0 | 1 | 1 | 0 | 1 | 0 | 1 | 0 | {fpg2, fqg, fsg} |

An analysis of FSMs shows that they achieve the same level of faults detection and isolation of the FSM in Table 10. Therefore, the Gas Fuel Subsystem can be fully diagnosed by evaluating only 4 ARRs between the ones given in the sets above presented, rather than 26 ARRs as required by Table 10.

As for the case of double-fault with 4 actual sensors there is a unique minimal set of 5 ARRs: {$ARR_5$, $ARR_9$, $ARR_{10}$, $ARR_{11}$, $ARR_{121}$}.

Further it is possible to determine the optimal set of sensors, i.e., the minimal set of sensors from all possible sensors, which achieves maximum level of faults detection and isolation for the system. In the case taken as an example this set is the set of three sensors of {FSGR, FSG, Q3 (or P3)}. Therefore, from the set of 551 ARRs, it is possible to select the set of 21 ARRs corresponding to the set of optimal sensors. The FSM for this set of sensors is presented in Table 14 and, in comparison with Table 10, it is easy to demonstrate that the optimal set of sensors achieves the same level of faults detection and isolation as the previous set of 4 actual sensors.

TABLE 14

The Fault Signature Matrix with the optimal set of 3 sensors FQG, FSG, and Q3

| | faults | | | | | | | | | |
|---|---|---|---|---|---|---|---|---|---|---|
| ARRs | GCVh | GCVm | Inj | SRVh | SRVm | TCpd | Tfqg | Tfsg | Tfsgr | Sensors |
| $ARR_9$ | 0 | 1 | 0 | 0 | 0 | 0 | 0 | 1 | 0 | {fsg} |
| $ARR_{22}$ | 1 | 0 | 0 | 1 | 0 | 0 | 1 | 0 | 0 | {fqg, q3} |
| $ARR_{62}$ | 0 | 0 | 0 | 1 | 1 | 0 | 1 | 0 | 1 | {fqg} |
| $ARR_{74}$ | 1 | 0 | 1 | 1 | 1 | 1 | 0 | 1 | 0 | {fsg, q3} |
| $ARR_{82}$ | 1 | 0 | 1 | 1 | 1 | 1 | 1 | 1 | 0 | {fsg, fqg, q3} |
| $ARR_{150}$ | 1 | 0 | 1 | 1 | 1 | 1 | 1 | 1 | 1 | {fsg, fqg, q3} |
| $ARR_{161}$ | 1 | 1 | 1 | 1 | 1 | 1 | 0 | 1 | 0 | {q3} |
| $ARR_{168}$ | 1 | 0 | 1 | 1 | 1 | 1 | 1 | 1 | 1 | {fsg, fqg, q3} |
| $ARR_{172}$ | 1 | 1 | 1 | 1 | 1 | 1 | 1 | 1 | 0 | {fqg, q3} |
| $ARR_{226}$ | 1 | 0 | 0 | 1 | 1 | 0 | 1 | 0 | 1 | {q3} |
| $ARR_{237}$ | 1 | 0 | 1 | 1 | 1 | 1 | 1 | 1 | 0 | {fsg, fqg} |
| $ARR_{272}$ | 1 | 0 | 1 | 1 | 1 | 1 | 1 | 1 | 1 | {fsg, q3} |

TABLE 14-continued

The Fault Signature Matrix with the optimal set of 3 sensors FQG, FSG, and Q3

| ARRs | GCVh | GCVm | Inj | SRVh | SRVm | TCpd | Tfqg | Tfsg | Tfsgr | Sensors |
|---|---|---|---|---|---|---|---|---|---|---|
| $ARR_{286}$ | 1 | 1 | 1 | 1 | 1 | 1 | 1 | 1 | 1 | {fqg, q3} |
| $ARR_{301}$ | 1 | 1 | 1 | 1 | 1 | 1 | 1 | 1 | 1 | {fqg, q3} |
| $ARR_{309}$ | 1 | 0 | 1 | 1 | 1 | 1 | 1 | 1 | 1 | {fsg, q3} |
| $ARR_{382}$ | 1 | 0 | 1 | 1 | 1 | 1 | 1 | 1 | 1 | {fsg, fqg} |
| $ARR_{384}$ | 1 | 1 | 1 | 1 | 1 | 1 | 1 | 1 | 0 | {fqg} |
| $ARR_{418}$ | 1 | 1 | 1 | 1 | 1 | 1 | 1 | 1 | 1 | {q3} |
| $ARR_{435}$ | 1 | 1 | 1 | 1 | 1 | 1 | 1 | 1 | 1 | {q3} |
| $ARR_{501}$ | 1 | 1 | 1 | 1 | 1 | 1 | 1 | 1 | 1 | {fqg} |
| $ARR_{511}$ | 1 | 0 | 1 | 1 | 1 | 1 | 1 | 1 | 1 | {fsg} |

By applying the method object of the invention for derivation of minimal set of ARRs for the FSM in Table 14 a set of size 4 given by $\{ARR_9, ARR_{22}, ARR_{62}, ARR_{74}\}$ is obtained. The FSM resulting from this minimal set is shown in Table 15 and it provides the same level of detection and isolation of faults of the FSMs of the Tables 10 and 14.

TABLE 15

The Fault Signature Matrix with Minimal Set of ARRS with the optimal set of 3 sensors FQG, FSG, and Q3

| ARRs | GCVh | GCVm | Injt | SRVh | SRVm | TCpd | Tfqg | Tfsg | Tfsgr | Sensors |
|---|---|---|---|---|---|---|---|---|---|---|
| $ARR_9$ | 0 | 1 | 0 | 0 | 0 | 0 | 0 | 1 | 0 | {fsg} |
| $ARR_{22}$ | 1 | 0 | 0 | 1 | 0 | 0 | 1 | 0 | 0 | {fqg, q3} |
| $ARR_{62}$ | 0 | 0 | 0 | 1 | 1 | 0 | 1 | 0 | 1 | {fqg} |
| $ARR_{74}$ | 1 | 0 | 1 | 1 | 1 | 1 | 0 | 1 | 0 | {fsg, q3} |

Finally, for the case of double-fault, a unique minimal set of 4 ARRs which is the same as the case of single-fault; i.e., $\{ARR_9, ARR_{22}, ARR_{62}, ARR_{74}\}$ is shown to exist.

CONCLUSIONS

The derivation method of Minimal Set of ARRs which is the object of invention allows advantageously a much faster system diagnosis starting from a complete set of ARRs and the resulting Fault Signature Matrix for any number of faults, since the Minimal Set of ARRs which was so constructed achieves the same level of detection and isolation as the complete set of ARRs.

Advantageously, the method subject of the invention allows to derive the minimal set (or the minimal sets) of ARRs without the need to perform an exhaustive search among all possible sets, which would be an impossible technique due to the fact that many systems of practical interest, even those with rather small size, might involve a very large number of ARRs.

Conveniently, the method is based on the formulation of a problem of binary integer linear programming and the corresponding implementation of an optimization procedure according to a branch-and-bound method.

An improvement of the described method allows to select one of a plurality of possible minimum sets of ARRs as a function of computational complexity for the assessment of ARRs which are involved, which is particularly relevant in the case of non-linear relations, resulting in a more efficient conduction of the diagnosis phase of the system in real time, in terms of execution speed and reliability of the results.

A further appreciation of the efficiency of the method follows from the consideration that, for complex systems describable by a complete set of ARRs of large dimensions, the minimum set of ARRs with the same degree of fault detection and isolation has a significantly less numerosity of the order of several orders of magnitude.

Of course, as far as the principle of the invention is maintained, the forms of implementation and details of embodiments can be widely varied with respect to what has been here described and illustrated purely as a non-limiting example, while remaining within the scope of the invention defined by the attached claims.

What is claimed is:

1. A computer-implemented method for generating a set of Analytical Redundancy Relations representing a system with which a plurality of sensors are associated for observation of variables indicative of operating conditions and adapted to enable detection and isolation of faults, the system being describable by a model based on the arrangement of components of said system, including a set of Primary Relations between inputs and outputs of each component, indicative of an operating function thereof, wherein each Analytical Redundancy Relation represents logical relations between a subset of observable variables of the system and a corresponding subset of support components of the system, including:

a) generating a complete set of Analytical Redundancy Relations for the system, in implicit form;

b) determining an original binary Fault Signature Matrix associated with said complete set of Analytical Redundancy Relations having size m×n where m is a power of the complete set of Analytical Redundancy Relations and n is a number of the system components;

c) determining at least one submatrix of said original signature matrix, having a minimal subset of rows of the original matrix such that said submatrix has the same number of non-zero columns and the same number of distinct columns as the original matrix; and d) generating a subset of Analytical Redundancy Relations of said complete set, including the Analytical Redundancy Relations associated to rows of the signature submatrix determined in step (c);

wherein the determination of at least one submatrix of the original signature matrix includes the operations of:
  determining a first matrix M transposed of the original signature matrix, having n rows and m columns;
  determining a second matrix $M_2$ having $n(n-1)/2$ rows and m columns, wherein each row is associated to a distinct pair of rows of the first matrix, and each element of each row is equal to 1 if corresponding elements of an associated pair of rows of the first matrix are distinct, and is equal to 0 otherwise; and
  determining a minimal linear combination $$x_1 + \ldots + x_m$$

complying with constraints $$M \cdot x \geq b \text{ and } M_2 \cdot x \geq b$$

where $x_1, \ldots, x_m$ are components of a binary vector $x=[x_1, x_2, \ldots, x_m]^T$ whose dimension corresponds to the number of rows of the original signature matrix and $b=[1, 1, \ldots, 1]^T$, b being a vector whose dimension corresponds to the number of columns of the original signature matrix;
the submatrix of the original signature matrix being determinable by transposing a matrix which is the product of the first matrix with the binary vector.

2. Method according to claim 1, wherein the determination of at least one submatrix of the original signature matrix (H) includes a solution of the problem of determining the minimal linear combination $$c_1 x_1 + \ldots + c_m x_m$$

complying with the constraints $$M \cdot x \geq b \text{ and } M_2 \cdot x \geq b$$

where $c_j$ is a weight associated to the j-th Analytical Redundancy Relations,
said weights being representative of a computational cost and/or of a precision of the numerical computation of an associated relation.

3. Method according to claim 1, wherein said binary signature matrix associated with the complete set of Analytical Redundancy Relations includes single-fault signature vectors associated with single components of the system and multiple-fault signature vectors associated with combinations of system components.

4. Method according to claim 3, wherein the dimension of the minimal set of Analytical Redundancy Relations adapted to provide a same degree of fault detection and isolation as the complete set of the system Analytical Redundancy Relations is at least equal to $\log_2 m+1$, for a system able to isolate m single or multiple faults.

5. Method according to claim 3, wherein the dimension of the minimal set of Analytical Redundancy Relations suitable to provide a same degree of fault detection and isolation as the complete set of the system Analytical Redundancy Relations is at most $m(m+1)/2$ for a system able to isolate m single or multiple faults.

6. Method for the diagnosis of a system with which a plurality of sensors is associated for the submission of variables indicative of operating conditions, said diagnosis being based on a system model representing an arrangement of the system components and including a set of primary relations between inputs and outputs of each component, representing the corresponding component operating function, said method including:
  a model-based system simulation based on the system model; and
  detecting system faults by comparing values expected from the simulation and the observed values of the observation variables of the system,
  the method includes:
  as a preliminary step,
    generating a minimal set of Analytical Redundancy Relations describing the system on the basis of the system model and of the observation sensors; and
    determining a fault signature matrix associated to said set of relations, including a plurality of fault signature vectors, said matrix representing the fault detection and isolation properties of a predetermined number of system components, according to the method described in claim 1; and
  in real time,
    computing said Analytical Redundancy Relations from the system inputs to determine the expected values;
    comparing the computed Analytical Redundancy Relations with the corresponding observed values to determine an observed system signature representing the unsatisfied Analytical Redundancy Relations; and
    comparing said observed signature with said fault signature vectors.

7. Diagnostic system, including a processing system arranged for carrying out a method for generating a set of Analytical Redundancy Relations representing a system with which a plurality of sensors are associated for observation of variables indicative of operating conditions and adapted to enable detection and isolation of faults,
the system being describable by a model based on the arrangement of components of said system, including a set of Primary Relations between inputs and outputs of each component, indicative of an operating function thereof,
wherein each Analytical Redundancy Relation represents logical relations between a subset of observable variables of the system and a corresponding subset of support components of the system,
including:
a) generating a complete set of Analytical Redundancy Relations for the system, in implicit form;
b) determining an original binary Fault Signature Matrix associated with said complete set of Analytical Redundancy Relations having size m x n where m is a power of the complete set of Analytical Redundancy Relations and n is a number of the system components;
c) determining at least one submatrix of said original signature matrix, having a minimal subset of rows of the original matrix such that said submatrix has the same number of non-zero columns and the same number of distinct columns as the original matrix; and
d) generating a subset of Analytical Redundancy Relations of said complete set, including the Analytical Redundancy Relations associated to rows of the signature submatrix determined in step (c);
wherein the determination of at least one submatrix of the original signature matrix includes the operations of:
  determining a first matrix M transposed of the original signature matrix, having n rows and m columns;

determining a second matrix $M_2$ having $n(n-1)/2$ rows and m columns, wherein each row is associated to a distinct pair of rows of the first matrix, and each element of each row is equal to 1 if corresponding elements of an associated pair of rows of the first matrix are distinct, and is equal to 0 otherwise; and determining a minimal linear combination $$x_1 + \ldots + x_m$$

complying with constraints $$M \cdot x \geq b \text{ and } M_2 \cdot x \geq b$$

where $x_1, \ldots, x_m$ are components of a binary vector $x=[x_1, x_2, \ldots, x_m]^T$ whose dimension corresponds to the number of rows of the original signature matrix and $b=[1, 1, \ldots, 1]^T$, b being a vector whose dimension corresponds to the number of columns of the original signature matrix;

the submatrix of the original signature matrix being determinable by transposing a matrix which is the product of the first matrix with the binary vector.

8. Computer program or set of programs, executable by a processing system, including one or more code modules for implementing a method for generating a set of Analytical Redundancy Relations representing a system with which a plurality of sensors are associated for observation of variables indicative of operating conditions and adapted to enable detection and isolation of faults, the system being describable by a model based on the arrangement of components of said system, including a set of Primary Relations between inputs and outputs of each component, indicative of an operating function thereof, wherein each Analytical Redundancy Relation represents logical relations between a subset of observable variables of the system and a corresponding subset of support components of the system, including:

a) generating a complete set of Analytical Redundancy Relations for the system, in implicit form;

b) determining an original binary Fault Signature Matrix associated with said complete set of Analytical Redundancy Relations having size m×n where m is a power of the complete set of Analytical Redundancy Relations and n is a number of the system components;

c) determining at least one submatrix of said original signature matrix, having a minimal subset of rows of the original matrix such that said submatrix has the same number of non-zero columns and the same number of distinct columns as the original matrix; and d) generating a subset of Analytical Redundancy Relations of said complete set, including the Analytical Redundancy Relations associated to rows of the signature submatrix determined in step (c);

wherein the determination of at least one submatrix of the original signature matrix includes the operations of:

determining a first matrix M transposed of the original signature matrix, having n rows and m columns;

determining a second matrix $M_2$ having $n(n-1)/2$ rows and m columns, wherein each row is associated to a distinct pair of rows of the first matrix, and each element of each row is equal to 1 if corresponding elements of an associated pair of rows of the first matrix are distinct, and is equal to 0 otherwise; and determining a minimal linear combination $$x_1 + \ldots + x_m$$

complying with constraints $$M \cdot x \geq b \text{ and } M_2 \cdot x \geq b$$

where $x_1, \ldots, x$ are components of a binary vector $x=[x_1, x_2, \ldots, x_m]^T$ whose dimension corresponds to the number of rows of the original signature matrix and $b=[1, 1, \ldots, 1]^T$, b being a vector whose dimension corresponds to the number of columns of the original signature matrix;

the submatrix of the original signature matrix being determinable by transposing a matrix which is the product of the first matrix with the binary vector.

* * * * *